United States Patent
Miyashita

(10) Patent No.: US 10,426,033 B2
(45) Date of Patent: Sep. 24, 2019

(54) PRINTED BOARD, DISPLAY DEVICE, AND METHOD OF MANUFACTURING THE DISPLAY DEVICE

(71) Applicant: JOLED INC., Tokyo (JP)

(72) Inventor: Hirofumi Miyashita, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/053,275

(22) Filed: Aug. 2, 2018

(65) Prior Publication Data

US 2019/0124769 A1 Apr. 25, 2019

(30) Foreign Application Priority Data

Oct. 24, 2017 (JP) .................................. 2017-205586

(51) Int. Cl.
| | | |
|---|---|---|
| H05K 1/11 | (2006.01) | |
| H05K 1/18 | (2006.01) | |
| H05K 1/14 | (2006.01) | |
| H05K 3/36 | (2006.01) | |

(52) U.S. Cl.
CPC ............ *H05K 1/117* (2013.01); *H05K 1/147* (2013.01); *H05K 1/189* (2013.01); *H05K 3/365* (2013.01); *H05K 3/368* (2013.01); *H05K 2201/09027* (2013.01); *H05K 2201/09145* (2013.01); *H05K 2201/09409* (2013.01); *H05K 2201/10128* (2013.01); *H05K 2201/10136* (2013.01); *H05K 2201/10962* (2013.01); *H05K 2203/04* (2013.01)

(58) Field of Classification Search
CPC .................. H05K 1/147; H05K 1/189; H05K 2201/10128; H05K 2201/10136

USPC .......................... 349/151, 149; 362/631, 633
See application file for complete search history.

(56) References Cited

U.S. PATENT DOCUMENTS

| | | | |
|---|---|---|---|
| 6,449,836 | B1 | 9/2002 | Miyake et al. |
| 2002/0189862 | A1 | 12/2002 | Miyake et al. |
| 2003/0079341 | A1 | 5/2003 | Miyake et al. |
| 2017/0090650 | A1* | 3/2017 | Jin ....................... H05K 1/0215 |

(Continued)

FOREIGN PATENT DOCUMENTS

| | | |
|---|---|---|
| JP | 08-181413 | 7/1996 |
| JP | 3879485 | 11/2006 |
| JP | 4590689 | 9/2010 |

*Primary Examiner* — Steven T Sawyer
(74) *Attorney, Agent, or Firm* — Greenblum & Bernstein, P.L.C.

(57) ABSTRACT

A printed board has an elongated shape and is to be electrically coupled to a display panel via a flexible board. The printed board includes a first board section; and a second board section shorter in length than the first board section in a substantially perpendicular direction to a longitudinal direction of the printed board. The first board section and the second board section are disposed in a row in the longitudinal direction, each of the first board section and the second board section has a first end in the substantially perpendicular direction to the longitudinal direction, the first end of the first board section projects further than the first end of the second board section in the substantially perpendicular direction, and a connection portion to be connected to the flexible board is disposed at the first end of each of the first board section and the second board section.

8 Claims, 8 Drawing Sheets

(56) References Cited

U.S. PATENT DOCUMENTS

2017/0135213 A1\* 5/2017 Lee ..................... G09G 3/2092
2018/0184523 A1\* 6/2018 Yoo ........................ H05K 1/147

\* cited by examiner

PRINTED BOARD, DISPLAY DEVICE, AND METHOD OF MANUFACTURING THE DISPLAY DEVICE

CROSS REFERENCE TO RELATED APPLICATIONS

The present application is based on and claims priority of Japanese Patent Application No. 2017-205586 filed on Oct. 24, 2017. The entire disclosure of the above-identified application, including the specification, drawings and claims is incorporated herein by reference in its entirety.

FIELD

The present disclosure relates to a printed board, a display device including the printed board, and a method of manufacturing the display device.

BACKGROUND

In related art, a display panel using organic electro luminescence (EL) is coupled via a flexible board to a printed board that supplies a power source and a signal to a drive circuit of the display panel. For instance, Japanese Unexamined Patent Application Publication No. 8-181413 discloses a printed board in which when formation of wiring on only one side of a base material is difficult due to a high packaging density of electronic components, a wiring pattern is formed using both front and back sides of the base material.

CITATION LIST

Patent Literature

Patent Literature 1: Japanese Unexamined Patent Application Publication No. 8-181413

SUMMARY

Technical Problem

The size of a printed board depends on the maximum size of components which are mounted on the printed board. For instance, in a rectangular printed board, the length (hereinafter also referred to as a width) of a side perpendicular to the side connected to a flexible board is determined according to the maximum size of components to be mounted. Meanwhile, from the viewpoint of cost reduction, there is a demand for miniaturized printed boards. Thus, cost reduction is attempted by providing a printed board in a variant shape in which the width of a portion (also referred to as a second board section) in which a component having a maximum size is not mounted is made smaller than the width of a portion (also referred to as a first board section) in which a component having a maximum size is mounted.

However, when the printed board as described above and a flexible board are connected by thermal compression bonding, the printed board is thermally expanded in a direction substantially parallel to the side to which the flexible board is connected, and the amount of expansion varies with the width of the printed board. In short, the amount of expansion is different between the first board section and the second board section. Specifically, the amount of expansion increases as the width of the printed board decreases. Thus, wrinkles tend to occur in the flexible board connected to the printed board, and wrinkles are more likely to occur in the flexible board connected to the second board section which is likely to expand thermally. A stress is applied to a flexible board in which wrinkles have occurred, and a reduced reliability problem arises.

Although an approach of reducing wrinkles by increasing the length of the flexible board is being studied, the approach leads to an increase in the cost of the flexible board.

The present disclosure has been conceived in view of the above-mentioned problem, and provides a printed board, a display device, and a method of manufacturing the display device that can achieve both ensuring of reliability and cost reduction.

Solution to Problem

In order to achieve the above-mentioned object, a printed board according to an aspect of the present disclosure is in an elongated shape to be electrically coupled to a display panel via a flexible board, the printed board including: a first board section; and a second board section that is shorter in length than the first board section in a substantially perpendicular direction to a longitudinal direction of the printed board. The first board section and the second board section are adjacent to each other in a row in the longitudinal direction, the first board section and the second board section each have a first end in the substantially perpendicular direction, the first end of the first board section projects further than the first end of the second board section in the substantially perpendicular direction, and a connection portion that is to be connected to the flexible board is disposed at the first end of each of the first board section and the second board section.

In order to achieve the above-mentioned object, a display device according to an aspect of the present disclosure includes: a display panel; the printed board described above; and a flexible board that couples the display panel and the printed board. The flexible board includes a first flexible board that couples the first board section and the display panel, and a second flexible board that couples the second board section and the display panel, and a length of the first flexible board in the substantially perpendicular direction to the longitudinal direction of the printed board is shorter than a length of the second flexible board in the substantially perpendicular direction.

In order to achieve the above-mentioned object, a method of manufacturing a display device according to an aspect of the present disclosure includes: preparing a display panel, the printed board described above, and the flexible board that couples the display panel and the printed board; and compression bonding the printed board and the flexible board. In the preparing, a first flexible board and a second flexible board are prepared, the second flexible board being longer in length than the first flexible board in a direction perpendicular to a longitudinal direction of the printed board, and in the compression bonding, the connection portion disposed at the first end of the first board section and the first flexible board are compression-bonded, and the connection portion disposed at the first end of the second board section and the second flexible board are compression-bonded.

Advantageous Effects

According to the present disclosure, it is possible to provide a printed board, a display device, and a method of manufacturing the display device that can achieve both ensuring of reliability and cost reduction.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS (Underlying Knowledge Forming Basis of the Present Disclosure)

As described above, to achieve reduction in the cost of printed board, an approach of making the outer shape of the printed board a variant shape is being studied.

First, the cost reduction of printed board will be described with reference to FIG. 7.

Figure 7:
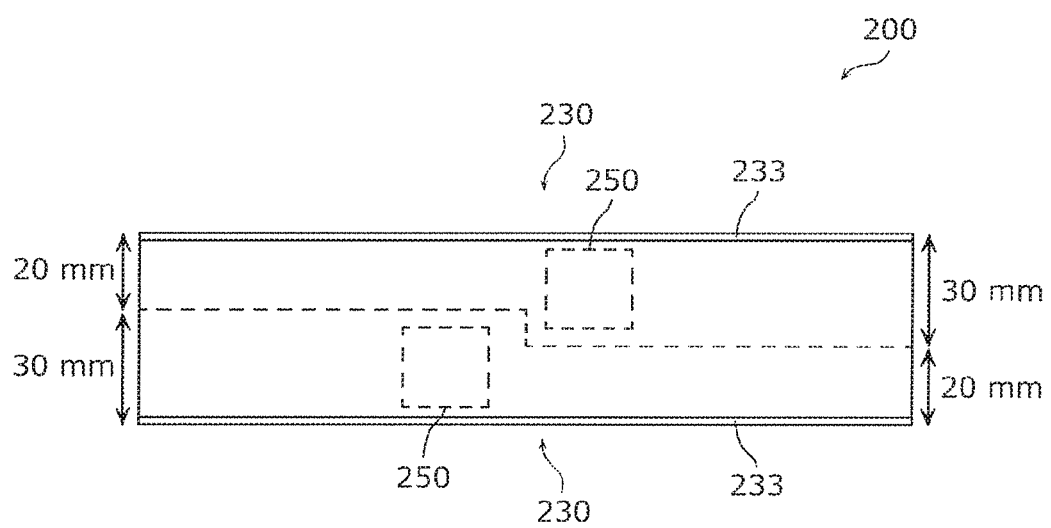
FIG. 7 is a view for explaining cost reduction of a printed board.

FIG. 7 is a view for explaining cost reduction of a printed board 230.

As illustrated in FIG. 7, the printed board 230 according to a comparative example is produced by dividing an original board 200 in which multiple printed boards 230 are formed. FIG. 7 illustrates an example in which the rectangular original board 200 includes two printed board 230 in a plan view (in other words, the original board 200 is a composite board). It is to be noted that the number of printed boards 230 formed in the original board 200 is not particularly limited. Also, "plan view" refers to viewing in the X-axis direction, and the same goes hereinafter.

Various electronic components are mounted on the printed board 230. Thus, the length (hereinafter also referred to as the width) of the printed board 230 in a substantially perpendicular direction to the longitudinal direction of the printed board 230 is determined according to an electronic component 250 with the largest size (see a frame-like dashed line in FIG. 7) among the various electronic components mounted on the printed board 230. FIG. 7 illustrates an example in which a width of 30 mm is necessary for mounting the electronic component 250 with the maximum size. In other words, the width of the printed board 230 needs to be at least 30 mm in a portion of the printed board 230, in which the electronic component 250 is mounted. On the other hand, a width of 30 mm may not be needed in a portion of the printed board 230, in which the electronic component 250 is not mounted. FIG. 7 illustrates an example in which the width of the printed board 230 may be 20 mm. It is to be noted that a variant shape indicates that the printed board 230 has portions with different widths in a plan view, for instance.

In this case, as illustrated in FIG. 7, the outer shape of the printed board 230 is made a variant shape in a plan view, specifically, the width of a portion in which the electronic component 250 is mounted is 30 mm, and the width of a portion in which the electronic component 250 is not mounted is 20 mm, and thus it is sufficient that the width of the original substrate 200 be 50 mm. On the other hand, when the outer shape of the printed board is rectangular, the width of each printed board needs to be 30 mm. That is, the width of the original board needs to be 60 mm. The size of the original board 200 can be reduced from 60 mm to 50 mm by making the outer shape of the printed board 230 a variant shape. Consequently, the cost of the printed board 230 can be reduced.

It is to be noted that a connection portion 233 connected to flexible boards 240 (see FIG. 8) is disposed at an end of the printed board 230 in a plan view. Specifically, the connection portions 233 are disposed at the end having a linear side of long sides of the printed board 230 in a plan view.

It is to be noted that the dimensions and the shape of the original board 200 and the printed board 230 illustrated in FIG. 7 are an example, and the embodiment is not limited to this.

Next, the case where the flexible board 240 is compression-bonded to the printed board 230 having a variant shape formed as described above will be described with reference to FIG. 8. It is to be noted that the compression bonding in the description of the present application means thermal compression bonding by heating and compression.

Figure 8:
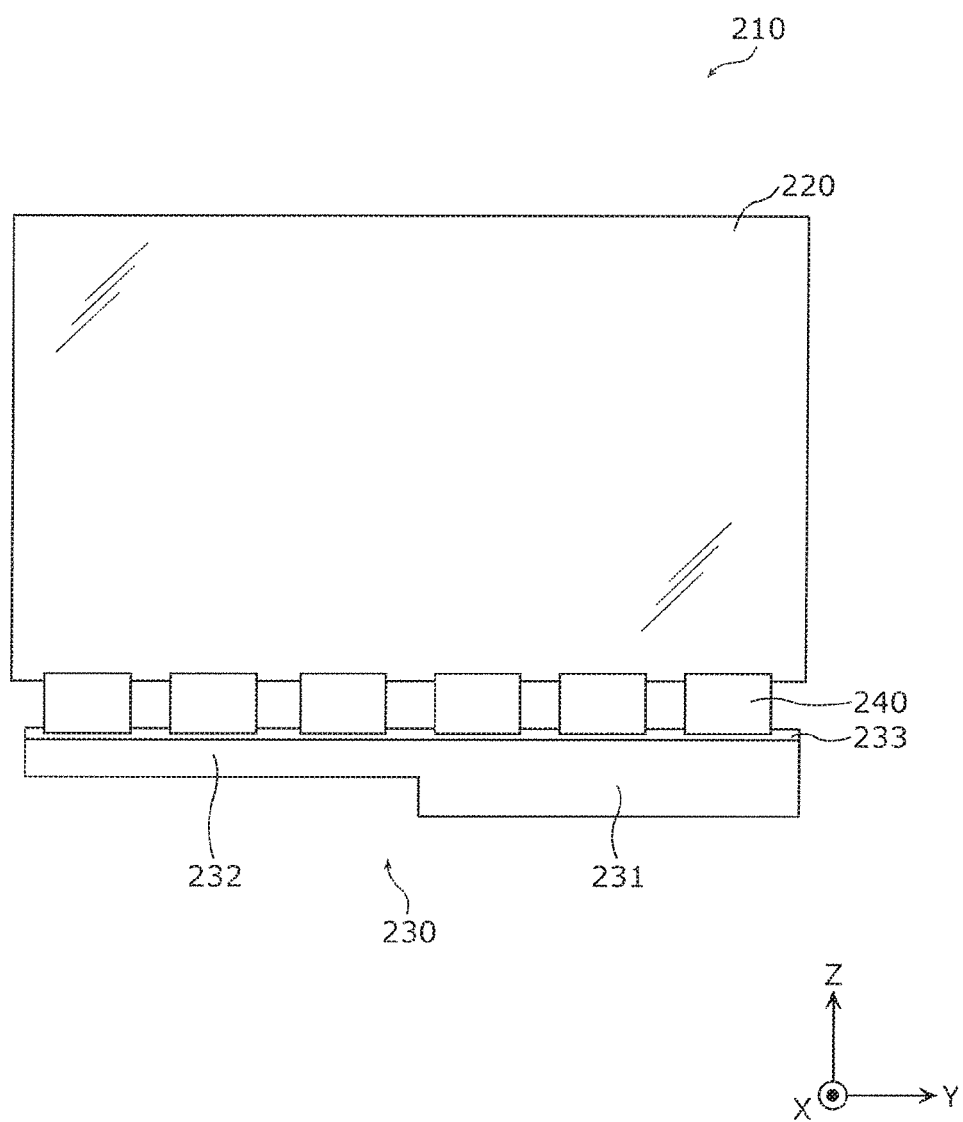
FIG. 8 is a schematic view illustrating the configuration of a display module according to a comparative example.

FIG. 8 is a schematic view illustrating the configuration of a display module 210 according to a comparative example. FIG. 8 illustrates an example in which the printed board 230 is electrically coupled to a display panel 220 (for instance, an organic EL panel) via the flexible boards 240.

As illustrated in FIG. 8, the printed board 230 according to a comparative example has the connection portion 233 for connecting the flexible boards 240 at the end having a linear side of long sides of the printed board 230 in a plan view, and thus the display panel 220 and the printed board 230 are electrically coupled using the flexible boards 240 having an approximately constant length.

Here, connection between the connection portion 233 of the printed board 230 and the flexible boards 240 is made by performing compression bonding using, for instance, an anisotropic conductive film (ACF). When compression bonding is performed, a temperature such as 150° C. or 170° C. is applied to the connection portion 233 in a plan view. Due to the temperature, the printed board 230 (mainly, the connection portion 233 and the surroundings of the connection portion 233) is thermally expanded. For instance, the printed board 230 is thermally expanded in the longitudinal direction of the printed board 230. In a state where the printed board 230 is thermally expanded, the printed board 230 and the flexible boards 240 are compression-bonded. After the compression bonding, the printed board 230 contracts as the temperature of the printed board 230 decreases, and the dimensions become equal to the original dimensions before the compression bonding. Consequently, the printed board 230 and the flexible boards 240 are connected.

It is to be noted that "equal to" in the description of the present application is not limited to the case of completely equal, but includes substantially equal. For instance, even when two values have an error of several percent, these values may be considered to be equal. Also, in the present application, "substantially" and "approximately" are not an expression that has a strict meaning only, but an expression that indicates that an essentially equivalent range, including, for instance, a difference of the order of several percent is allowed.

In general, the amount of expansion of the printed board 230 due to thermal expansion varies with the thickness of the board, and when the layer configuration is the same, the amount of expansion varies with the width of the printed board 230. For instance, heat is more likely to escape in a first board section 231 which is a portion, having a large width, of the printed board 230 than in a second board section 232 which is a portion, having a small width, of the printed board 230. In other words, the second board section 232 has a temperature higher than that of the first board section 231, and thermal expansion occurs more prominently. That is, at the time of compression bonding, the amount of expansion due to thermal expansion of the second board section 232 is greater than that of the first board section 231. It is to be noted that the amount of expansion means the same in the longitudinal direction of the printed board 230.

Therefore, in contraction of the printed board 230 after compression bonding, the amount of contraction of the second board section 232 is larger than that of the first board section 231. Consequently, a higher stress due to contraction of the printed board 230 is applied to a flexible board 240 connected to the second board section 232 (specifically, the connection portion 233 disposed at an end of the second board section 232) than a stress applied to a flexible board 240 connected to the first board section 231, and wrinkles are likely to occur in the flexible board 240 connected to the second board section 232. In other words, an undesired stress is applied to the flexible board 240 after compression bonding, which leads to reduction in reliability of connection between the printed board 230 and the flexible boards 240.

Thus, an approach of ensuring connection reliability by increasing the length of each flexible board 240 to reduce wrinkles is being studied. However, the length of each flexible board 240 connected to the connection portion 233 of the first board section 231 is also increased by the approach, which unnecessarily increases the length of a flexible board 240 in which the degree of wrinkles is less or wrinkles have not occurred, as compared with each flexible board 240 connected to the connection portion 233 of the second board section 232. In short, unnecessary increase in the cost of the flexible board 240 is caused.

As described above, with the printed board 230 according to a comparative example, it is not possible to achieve both ensuring of reliability and cost reduction. Thus, the inventor of this application has actively studied about a printed board capable of achieving both ensuring of reliability and cost reduction. The inventor of this application has found that it is possible to achieve both ensuring of reliability and cost reduction by changing the position of the connection portion disposed in the printed board.

Hereinafter, an embodiment of the present disclosure will be described with reference to the drawings. It is to be noted that the embodiments described below each shows a specific example of the present disclosure. Therefore, numerical values, shapes, materials, structural components, the arrangement and connection of the structural components, steps, the sequence of the steps shown in the following embodiments are mere examples, and are not intended to limit the scope of the present disclosure. Those structural components in the following embodiments, which are not stated in the independent claim that defines the most generic concept are each described as an arbitrary component.

It is to be noted that the respective figures are schematic diagrams and are not necessarily precise illustrations. In the drawings, essentially the same components are labeled with the same symbol, and a redundant description may be omitted or simplified.

Embodiment

[1. Configuration of Display Module]

The configuration of a display module according to this embodiment will be described with reference to FIGS. 1 to 3.

Figure 1:
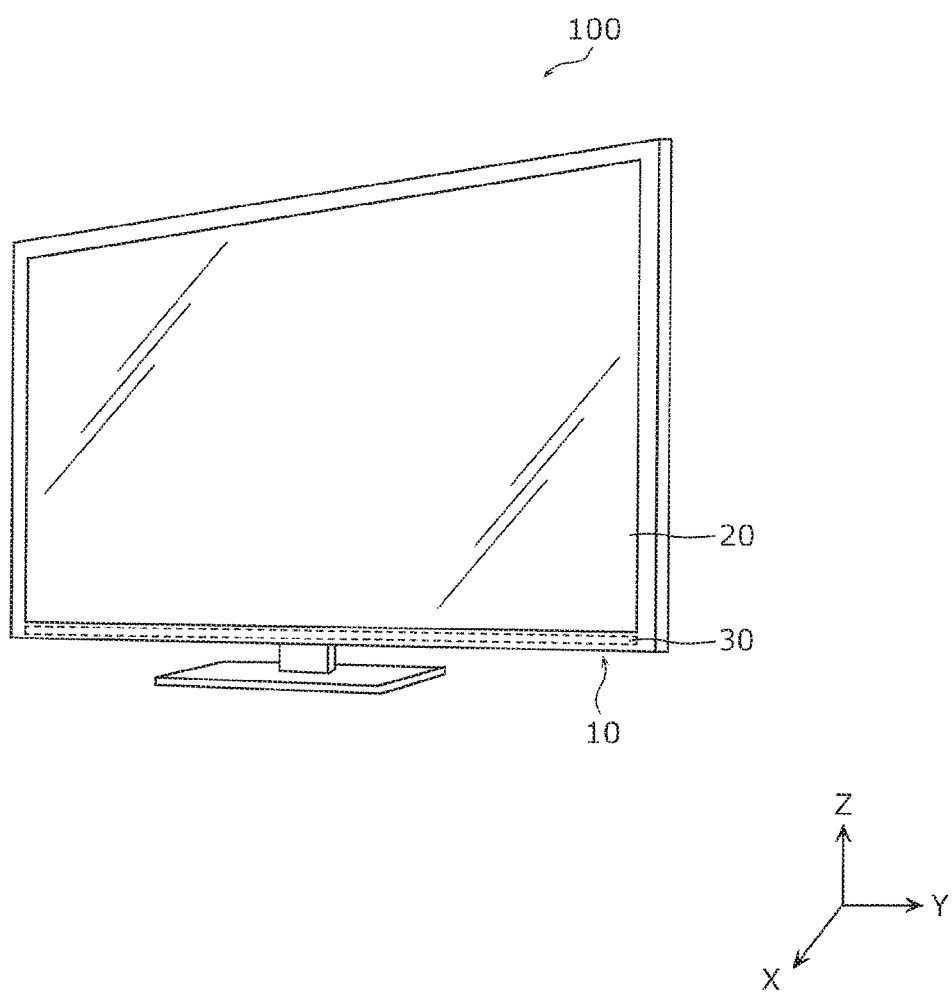
FIG. 1 is a perspective view illustrating an example of a display device including a display module according to an embodiment.

FIG. 1 is a perspective view illustrating an example of a display device 100 including a display module 10 according to the embodiment. FIG. 2 is a schematic view illustrating the configuration of the display module 10 according to the embodiment.

As illustrated in FIG. 1, the display device 100 including the display module 10 according to the embodiment is, for instance, a thin display device that displays an image of a television or the like. The image displayed by the display device 100 is not particularly limited. The image may be a motion image or may be a still image. Also, the image may be a character or a numeric character.

Figure 2:
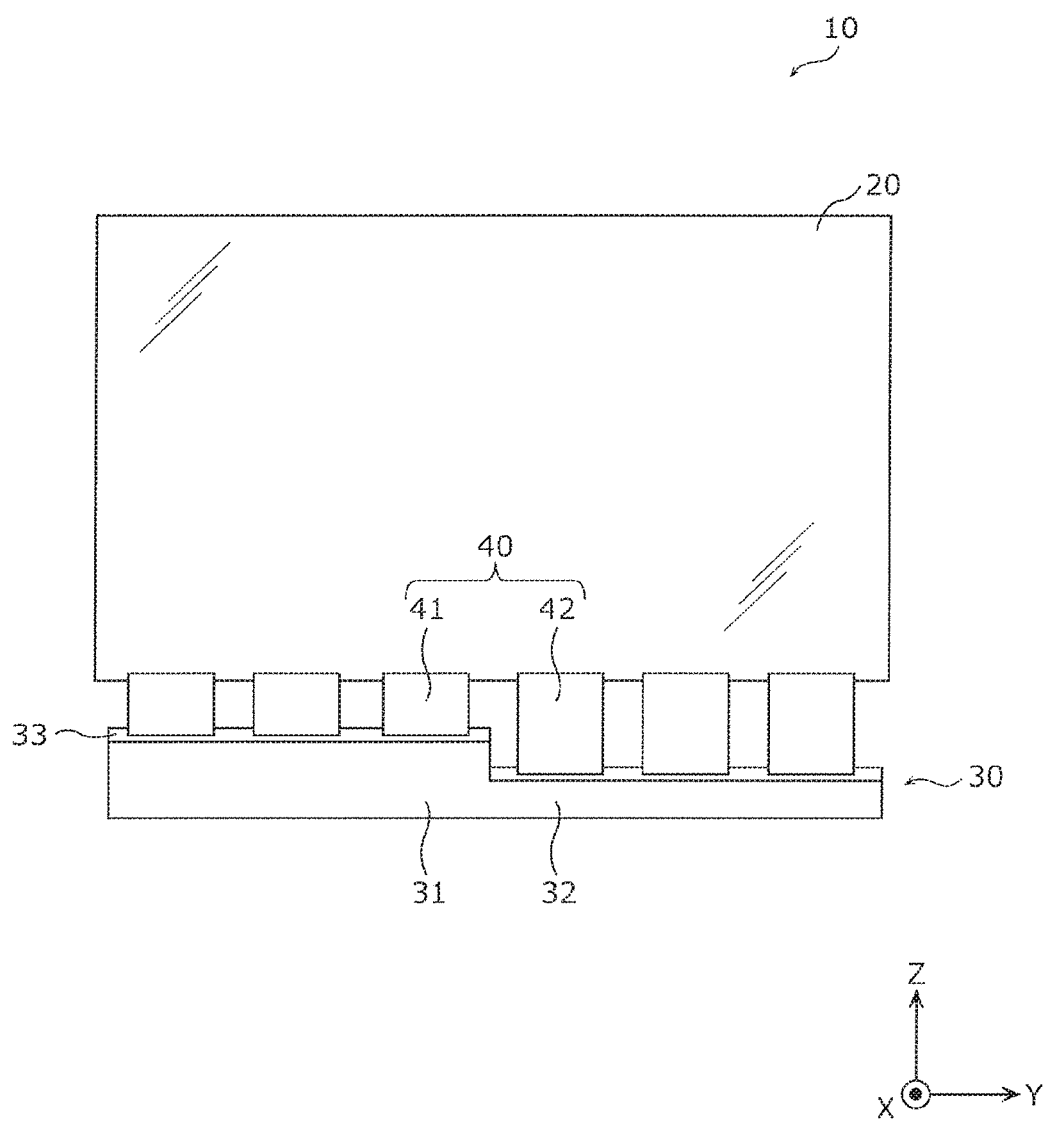
FIG. 2 is a schematic view illustrating the configuration of the display module according to the embodiment.

As illustrated in FIG. 2, the display module 10 includes a display panel 20, a printed board 30, and flexible boards 40.

Hereinafter the components included in the display module 10 will be described with reference to the drawings as needed.

[1-1. Display Panel]

The display panel 20 will be described with reference to FIG. 2.

The display panel 20 is a display that displays an image. The display panel 20 is achieved by an organic EL panel or a liquid crystal panel, for instance. When the display panel 20 is a liquid crystal panel, the display module 10 may include a light source having multiple light emitting diodes (LED).

Although not illustrated, a source driver and a gate driver may be mounted on the display panel 20. In other words, the display panel 20 may be a display panel in which chip-on-glass (COG) is mounted.

Although the size of the display panel 20 is not particularly limited, the size is approximately 20 inches as an example. Also, the board included in the display panel 20 is not particularly limited.

The board may be a glass board or may be a plastic board. In addition, the board may have flexibility.

[1-2. Printed Board]

The printed board 30 will be described with reference to FIG. 2, and be described in detail with reference to FIG. 3.

As illustrated in FIG. 2, the printed board 30 is electrically coupled to the display panel 20 via the flexible boards 40, and supplies a signal for displaying a power source and an image to drive circuits (for instance, a source driver and a gate driver) of the display panel 20.

The printed board 30 is an elongated plate material which is long in the longitudinal direction (the Y-axis direction) of the display panel 20 in a plan view. As illustrated in FIG. 2, the printed board 30 has a variant shape in a plan view. Specifically, the end of the printed board 30, opposed to the display panel 20, has a step shape in a plan view. Thus, the outer shape of the printed board 30 according to the embodiment in a plan view is not rectangular. As an example, the printed board 30 has a shape in which only one of four corners forming a rectangle is cut in a rectangle form. Thus, as described above, reduction in the cost of the printed board 30 is achieved.

Figure 3:
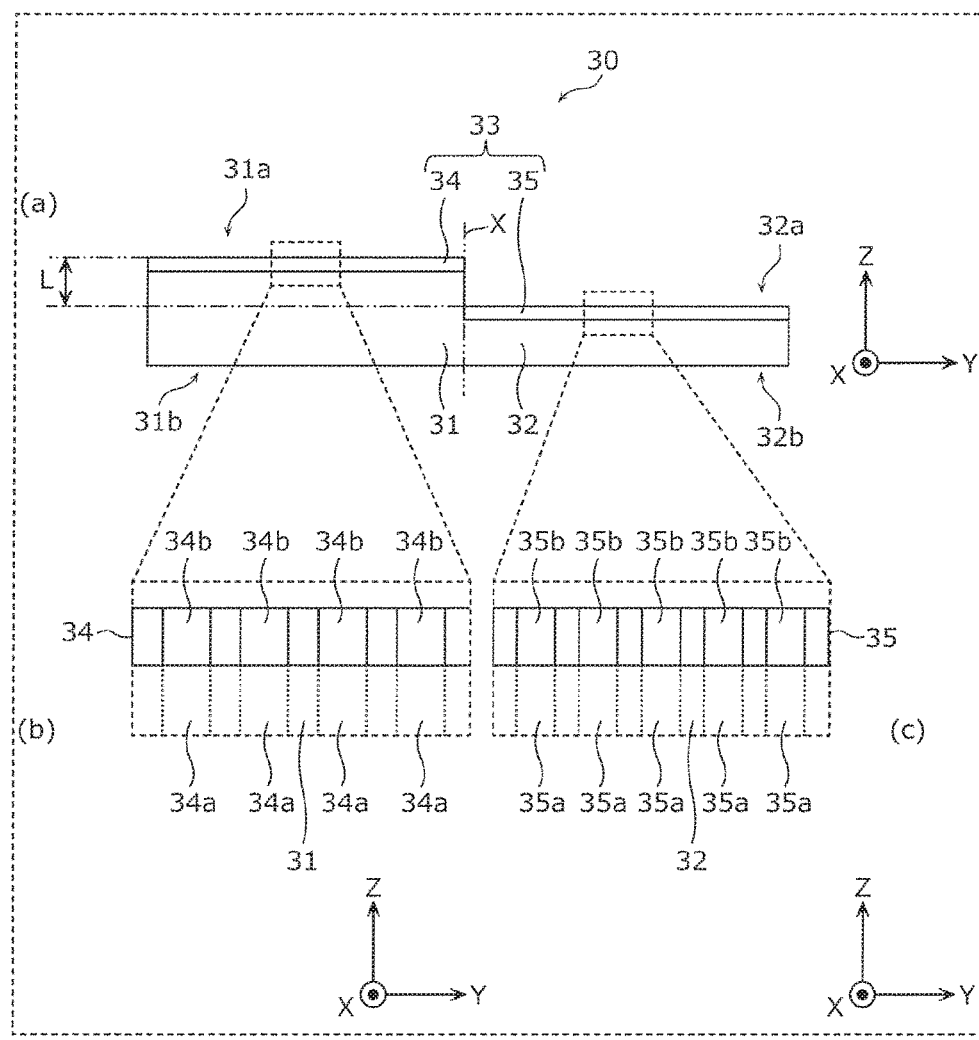
FIG. 3 is a schematic view illustrating the configuration of a printed board according to the embodiment.

FIG. 3 is a schematic view illustrating the configuration of the printed board 30 according to the embodiment. Specifically, (a) in FIG. 3 is a schematic view illustrating the configuration of the printed board 30 according to the embodiment.

As illustrated in (a) in FIG. 3, the printed board 30 is a mounting board in which multiple electronic components are mounted, and includes a first board section 31 and a second board section 32.

Multiple electronic components, such as an integrated circuit (IC) for a timing controller, a power supply circuit, and a connector, are mounted on the printed board 30. In addition, wiring patterns (for instance, a first wiring pattern 34a and a second wiring pattern 35a illustrated in (b) and (c) in FIG. 3) for electrically connecting multiple electronic components and a connection portion 33 are also formed in the printed board 30. The power supply circuit supplies a driving power for driving the source driver and the gate driver. It is to be noted that an electronic component other than the IC for a timing controller, the power supply circuit, and the connector may be mounted on the printed board 30.

The first board section 31 and the second board section 32 are disposed in a row in the longitudinal direction of the printed board 30 (the direction parallel to the Y-axis direction, and hereinafter simply referred to as the longitudinal direction). Although the first board section 31 is disposed on the negative side of the Y-axis with respect to the second board section 32 in the embodiment, the arrangement of the first board section 31 and the second board section 32 is not limited to this.

In contrast to the first board section 31, the second board section 32 has a shorter length in the substantially perpendicular direction to the longitudinal direction.

The width of the first board section 31 and the second board section 32 are determined as appropriate according to the sizes (for instance, the length in the direction parallel to the direction perpendicular to the longitudinal direction of the printed board 30) of electronic components to be mounted. As an example, the width of the first board section 31 is approximately 30 mm, and the width of the second board section 32 is approximately 20 mm. For instance, an electronic component having the largest size among the multiple electronic components (in other words, an electronic component which is mounted on the printed board 30 and has the longest widthwise length of the printed board 30) is mounted on the first board section 31. Hereinafter, the substantially perpendicular direction to the longitudinal direction of the printed board 30 is also referred to as the width direction. In short, the width direction is the transverse direction of the printed board 30. The electronic component having the largest size to be mounted on the first board section 31 is not particularly limited, however, may be the IC for a timing controller as an example.

For instance, the first board section 31 and second board section 32 are each an elongated board which has, as the longitudinal direction, a direction substantially parallel to the longitudinal direction of the display panel 20.

As illustrated in (a) in FIG. 3, the first board section 31 and the second board section 32 respectively have first ends 31a and 32a in the width direction, and second ends 31b and 32b on the opposite side of the first ends 31a and 32a. Specifically, the first board section 31 has the first end 31a and the second end 31b on the opposite side of the first end 31a, and the second board section 32 has the first end 32a and the second end 32b on the opposite side of the first end 32a. Between the first ends 31a and 32a, the first end 31a on the side of the first board section 31 projects further than the first end 32a on the side of the second board section 32 in the width direction. It is to be noted that in the embodiment, the first end 31a and 32a are at the end of the positive side of the Z-axis in the printed board 30, and the second end 31b and 32b are at the end of the negative side of the Z-axis in the printed board 30.

In the embodiment, the first board section 31 is formed so as to project more than the second board section 32 in one of width directions (the direction from the negative side of the Z-axis to the positive side of the Z-axis). The first end 31a on the positive side of the Z-axis between the extended ends (specifically, the first end 31a and the second end 31b) of the first board section 31 in a direction substantially parallel to the longitudinal direction of the first board section 31 is formed at a position more projecting in one direction than the first end 32a on the positive side of the Z-axis between the extended ends (specifically, the first end 32a and the second end 32b) of the second board section 32 in a direction substantially parallel to the longitudinal direction of the second board section 32. In other words, the first end 31a of the first board section 31 is disposed nearer to the display panel 20 than the first end 32a of the second board section 32 in a plan view.

Also, the second ends 31b and 32b on the opposite side of the first ends 31a and 32a have a linear shape in a plan view. Specifically, the second ends 31b and 32b have a straight linear shape from the end of the negative side of the Y-axis of the second end 31b to the end of the positive side of the Y-axis of the second end 32b in a plan view. In other words, the end face of the negative side of the Z-axis of the printed board 30 is a flush face (flat face). That is, in the printed board 30 according to the embodiment, only one end has a step shape in a plan view. In the embodiment, as illustrated in FIG. 1, the one direction is the direction from the printed board 30 toward the display panel 20.

The ends (the first ends 31a and 32a and the second ends 31b and 32b) of the printed board 30 according to the embodiment indicate the end vicinity of the printed board 30. For instance, the first end 31a indicates the end vicinity of the first board section 31 near the display panel 20, and the second end 31b indicates the end vicinity of the first board section 31 on the opposite side of the display panel 20.

The connection portion 33 has multiple compression bonding terminals (lands), and is connected to the flexible boards 40. As illustrated in (a) in FIG. 3, the connection portion 33 is disposed at the first ends 31a and 32a. Specifically, the connection portion 33 includes a first connection portion 34 disposed at the first end 31a, and a second connection portion 35 disposed at the first end 32a. The printed board 30 according to the embodiment has a feature that a connection portion 33 to be connected to the flexible boards 40 is disposed in both the first ends 31a and 32a which form the step shape of the printed board 30. In other words, in a plan view, a connection portion 33 to be connected to the flexible boards 40 is not disposed in the linear second ends 31b and 32b.

The first connection portion 34 and the second connection portion 35 are formed in an elongated shape, for instance. It is to be noted that the longitudinal direction of the printed board 30 and the longitudinal direction of the first connection portion 34 and the second connection portion 35 are substantially parallel.

A compression bonding terminal provided in the connection portion 33, and a compression bonding terminal provided in one end of the flexible board 40 (in other words, one end vicinity of the flexible board 40) are compression-bonded via an adhesion member. The adhesion member may be a member that allows the printed board 30 and the flexible boards 40 to conduct and be fixed. The adhesion member is ACF as an example, however may be solder. The compression bonding terminal is an example of a connection terminal.

Also, a compression bonding terminal provided at the other end of each flexible board 40, and a compression bonding terminal provided in the display panel 20 are compression-bonded via an adhesion member. Although the adhesion member is not particularly limited, similarly to the bonding between the printed board 30 and the flexible boards 40, ACF is used as an example.

As described above, the printed board 30 and the flexible boards 40 are electrically connected and the display panel 20 and the flexible boards 40 are electrically connected by a conductive member contained in the adhesion member. Therefore, the display panel 20 and the printed board 30 are electrically coupled via the flexible boards 40. Also, the printed board 30 and the flexible boards 40 are connected mechanically and the display panel 20 and the flexible boards 40 are connected mechanically by an adhesive contained in the adhesion member.

Here, the wiring patterns formed in the connection portion 33 will be described with reference to (b) and (c) in FIG. 3.

(b) in FIG. 3 is a partially enlarged view of a dashed line area including the first connection portion 34 of (a) in FIG. 3, and (c) in FIG. 3 is a partially enlarged view of a dashed line area including the second connection portion 35 of (a) in FIG. 3.

As illustrated in (b) in FIG. 3, first wiring patterns 34a are formed in the first board section 31, and a first compression bonding terminal 34b electrically connected to a corresponding one of the first wiring patterns 34a is formed in the first connection portion 34. Also, as illustrated in (c) in FIG. 3, second wiring patterns 35a are formed in the second board section 32, and a second compression bonding terminal 35b electrically connected to a corresponding one of the second wiring patterns 35a is formed in the second connection portion 35. As illustrated in (b) and (c) in FIG. 3, the first compression bonding terminals 34b and the second compression bonding terminals 35b are different in size. Specifically, the length (the length in the Y-axis direction, and hereinafter, also referred to as the width) of the first compression bonding terminal 34b provided in the first connection portion 34, in the direction parallel to the longitudinal direction of the printed board 30 is larger than the width of the second compression bonding terminal 35b provided in the second connection portion 35. In other words, the width of the first compression bonding terminal 34b provided in the first connection portion 34 disposed in the first board section 31 with a large width of the printed board 30 is greater than the width of the second compression bonding terminal 35b provided in the second connection portion 35 disposed in the second board section 32 smaller in width than the first board section 31.

The width of the second compression bonding terminal 35b provided in the second connection portion 35 which has a large expansion amount at the time of heating is made smaller than the width of the first compression bonding terminal 34b provided in the first connection portion 34 which has an expansion amount at the time of heating less than that of the second connection portion 35. Thus, the first compression bonding terminal 34b and the second compression bonding terminal 35b can have the same width after thermal expansion due to heating. That is, the widths of the first compression bonding terminal 34b and the second compression bonding terminal 35b are determined according to the amounts of expansion of the first connection portion 34 and the second connection portion 35.

Although the details will be described later, the widths of the first compression bonding terminal 34b and the second compression bonding terminal 35b before thermal expansion occurs are determined so that the widths of the first compression bonding terminal 34b and the second compression bonding terminal 35b when thermal expansion occurs match the respective widths of the compression bonding terminals provided in the flexible boards 40 connected to the first connection portion 34 and the second connection portion 35. After all, the widths of the first compression bonding terminal 34b and the second compression bonding terminal 35b are determined according to the amount of expansion of the printed board 30 (mainly, the first connection portion 34 and the second connection portion 35), and the widths of the compression bonding terminals provided in the flexible boards 40.

Thus, in contrast to the case where the widths of the first compression bonding terminal 34b and the second compression bonding terminal 35b before compression bonding are formed to match the widths of the compression bonding terminals of the flexible boards 40, it is possible to avoid reduction in the contact area, in other words, increase in the contact resistance, the reduction in the contact area being caused by displaced compression bonding in a plan view between the first and second compression bonding terminals 34b, 35b, and the compression bonding terminals of the flexible boards 40 due to thermal expansion at the time of compression bonding.

Next, an example of steps of determining the widths of the first compression bonding terminal 34b and the second compression bonding terminal 35b will be described. Specifically, the steps of reducing the widths of the first compression bonding terminal 34b and the second compression bonding terminal 35b with respect to the widths of the compression bonding terminals of the flexible boards 40 will be described.

First, the amount of expansion (the amount of thermal expansion) of the printed board 30 due to thermal expansion is measured from the sizes of the printed board 30 before and after compression bonding of the printed board 30 having a variant shape. The amount of expansion is measured for each of the first board section 31 and the second board section 32. In other words, the amount of expansion is measured for each of areas with different widths of the printed board 30. In the measurement, for instance, the amount of expansion of each of the first board section 31 and the second board section 32 is measured with respect to the boundary (for instance, see a reference line X of (a) in FIG. 3) between the first board section 31 and the second board section 32.

Specifically, the amount of expansion of the first board section 31 is measured by subtracting the length in the direction parallel to the longitudinal direction of the printed board 30 in the first board section 31 immediately after compression bonding (in other words, when thermal expansion occurs) from the length in the direction parallel to the longitudinal direction of the printed board 30 in the first board section 31 before compression bonding (in other words, before thermal expansion). The amount of expansion of the second board section 32 is measured in the same manner. Thus, the amount of expansion of each of the first board section 31 and the second board section 32 is measured. In the following, let a first amount of expansion be the amount of expansion of the first board section 31, and a second amount of expansion be the amount of expansion of the second board section 32, then a description will be given. It is to be noted that the first amount of expansion is greater than the second amount of expansion.

An amount of correction for the printed board 30 is calculated from the measured amount of expansion. The amount of correction is calculated for each of areas with different widths of the printed board 30. In the embodiment, an amount of correction is calculated for each of the first board section 31 and the second board section 32.

Specifically, the amount of correction for the first board section 31 (hereafter also referred to as the first amount of correction) is calculated by dividing the first amount of expansion by the number of the first compression bonding terminals 34b provided in the first connection portion 34. In other words, the first amount of correction is a correction amount for determining the width of each first compression bonding terminal 34b with respect to the width of the compression bonding terminal of each flexible board 40. The amount of correction (hereafter also referred to as the second amount of correction) for the second board section 32 is calculated similarly. Also, the second amount of correction is a correction amount for determining the width of each second compression bonding terminal 35b with respect to the width of the compression bonding terminal of each flexible board 40. The width of each of the first compression bonding terminal 34b and the second compression bonding terminal 35b is determined in consideration of the calculated amount of correction.

Since the printed board 30 is thermally expanded, the above-described subtraction gives a negative value of the first amount of correction and the second amount of correction. Thus, the width of each of the first compression bonding terminal 34b and the second compression bonding terminal 35b is smaller in size than the width of the compression bonding terminal of a corresponding flexible board 40. Also, between the first amount of correction and the second amount of correction, the second amount of correction is greater than the first amount of correction. In other words, the second compression bonding terminal 35b is smaller in terminal width than the first compression bonding terminal 34b.

As described above, although the printed board 30 according to the embodiment is a printed board in shrink design, the correction amount to be reduced is different between the first board section 31 and the second board section 32.

Although the example has been described in the above, in which
the widths of the compression bonding terminals provided in the first connection portion 34 and the second connection portion 35 are different, that is, the widths of the compression bonding terminals are different because of different widths in the printed board 30, the embodiment is not limited to this. For instance, the widths of the first compression bonding terminal 34b and the second compression bonding terminal 35b may be the same.

The structure and the material of the printed board 30 is not particularly limited as long as the above-mentioned electronic components can be mounted. The printed board 30 may have a single layer structure or a multi-layer structure. Also, the printed board 30 has an insulating layer including an insulating member such as glass epoxy, for instance. When the printed board 30 has a multi-layer structure, the printed board 30 has multiple insulating layers. A wiring pattern (conductive layer) including a conductive member such as copper is formed in each of the multiple insulating layers. Also, in the case of a multi-layer structure, via wiring which penetrates the insulating layers may be formed in the printed board 30. Also, plate processing (for instance, gold plate processing) may be performed on the compression bonding terminals (specifically, the first compression bonding terminal 34b and the second compression bonding terminal 35b) provided in the connection portion 33. The printed board 30 is a rigid board.

Also, as illustrated in (a) in FIG. 3, the lengths of the first connection portion 34 and the second connection portion 35 are equal. Thus, two printed boards having the same shape can be cut from a single original board.

[1-3. Flexible Board]

The flexible board 40 will be described with reference to FIG. 2.

As illustrated in FIG. 2, the flexible board 40 is a cable that electrically couples the display panel 20 and the printed board 30.

The flexible board 40 includes a first flexible board 41 and a second flexible board 42 that are different in length. The length in the direction (hereinafter also referred to as the length) perpendicular to the longitudinal direction of the printed board 30 of each of the first flexible board 41 and the second flexible board 42 is determined by the width of the printed board 30 connected to the first flexible board 41 and the second flexible board 42. Specifically, the first flexible board 41 connected to the first board section 31 having a large width of the printed board 30 is smaller in length than the second flexible board 42 connected to the second board section 32 having a width smaller than the width of the first board section 31. More specifically, the first flexible board 41 is shorter than the second flexible board 42 by the length L illustrated in (a) in FIG. 3. The length L is the difference between the width of the first board section 31 and the width of the second board section 32. More specifically, the length L is the distance between the ends (the first ends 31a and 32a) of the first board section 31 and the second board section 32 in the width direction.

Although not illustrated, the flexible board 40 is formed of a base material layer including a resin material and a conductive layer including a conductive member such as metal. The base material layer is, for instance, a flexible insulating film such as polyimide. Also, the conductive layer is, for instance, a metallic foil, a laminated metallic foil, or a metallic foil having a surface covered with solder. The metallic foil and the wire are composed of Cu or Ag, for instance.

It is to be noted that the number of flexible boards 40 which couple the display panel 20 and the printed board 30 is not particularly limited.

[2. Method of Manufacturing Display Device]

Next, a method of manufacturing the display device 100 according to the embodiment will be described with reference to FIGS. 4 and 5.

Figure 4:
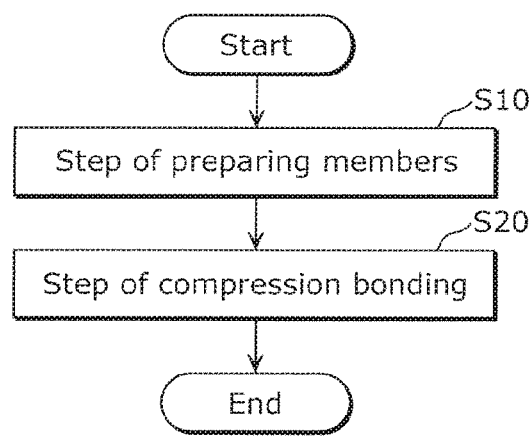
FIG. 4 is a flowchart illustrating a method of manufacturing the display device according to the embodiment.

FIG. 4 is a flowchart illustrating a method of manufacturing the display device 100 according to the embodiment. Specifically, FIG. 4 is a flowchart illustrating a manufacturing method to produce the display module 10 included in the display device 100.

First, a step of preparing various members for producing the display module 10 is performed (S10). In the preparation step, the display panel 20, the printed board 30, the flexible boards 40, ACF, and others are prepared. If a member is necessary for producing the display module 10, the member other than mentioned above may be prepared.

In step S10, the printed board 30 having a variant shape and flexible boards 40 in two lengths corresponding to the variant shape of the printed board 30 are prepared. In the embodiment, flexible boards in two lengths are prepared: the first flexible board 41 and the second flexible board 42. As described above, the length of the first flexible board 41 is shorter than the length of the second flexible board 42.

A step of compression-bonding the printed board 30 and the flexible board 40 as well as the display panel 20 and the flexible board 40 is performed (S20).

When the printed board 30 and the flexible board 40 are compression-bonded, the length of the flexible board 40 to be used is changed according to the width of the printed board 30. Specifically, in the first board section 31 which is an area where the width of the printed board 30 is large, the first flexible board 41 having a shorter length of the flexible board 40 is used. Also, in the second board section 32 which is an area where the width of the printed board 30 is small, the second flexible board 42 having a longer length of the flexible board 40 is used. In other words, the second flexible board 42 is used in an area which is likely to be thermally expanded at the time of compression bonding, and in which a stress is likely to be applied to the flexible board 40 after compression bonding. In other words, the second flexible board 42 is used for the second board section 32 which is likely to cause wrinkles to occur in the compression-bonded flexible board, so that wrinkles can be reduced. Also, the first flexible board 41 is used for the first board section 31 which is less likely to cause wrinkles to occur in the compression-bonded flexible board and the length of the flexible board 40 does not need to be increased.

The compression bonding between the first connection portion 34 and the second connection portion 35, and the flexible board 40 may be performed simultaneously or may be performed separately.

Also, the compression bonding between the printed board 30, the display panel 20, and flexible board 40 may be performed simultaneously or may be performed separately.

Here, the thermal expansion at the time of compression bonding of the printed board 30 will be described with reference to FIG. 5.

Figure 5:
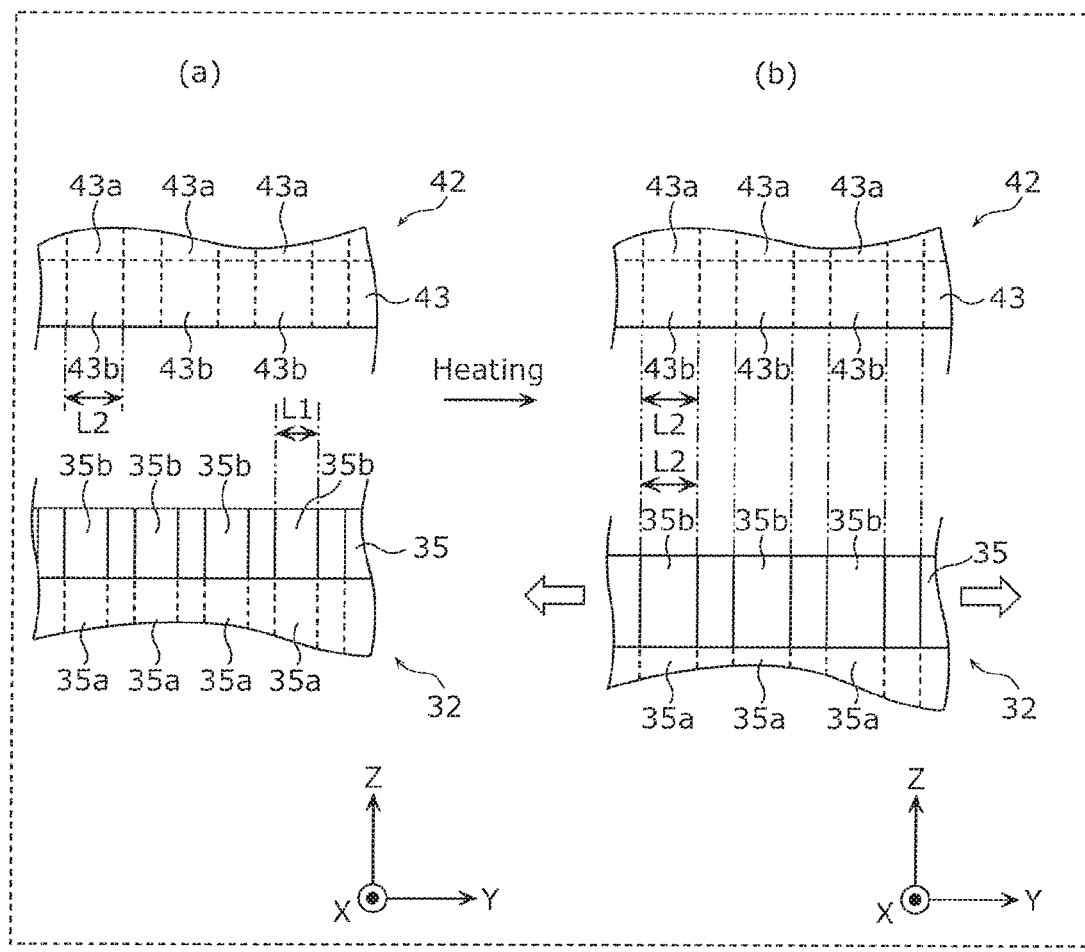
FIG. 5 is a view for explaining thermal expansion at the time of compression bonding of the printed board according to the embodiment.

FIG. 5 is a view for explaining the thermal expansion at the time of compression bonding of the printed board 30 according to the embodiment. As an example, an explanation will be given using the second connection portion 35 of the printed board 30. (a) in FIG. 5 illustrates the second connection portion 35, and a connection portion 43 of the second flexible board 42 before compression bonding. (b) in FIG. 5 illustrates the second connection portion 35 and the connection portion 43 at the time of compression bonding, in other words, at the time of thermal expansion of the printed board 30.

In the step of compression bonding, the second connection portion 35, and the connection portion 43 of the second flexible board 42 are disposed to be overlapped in a plan view and compression-bonded. However, for the sake of description, the second connection portion 35 and the connection portion 43 are illustrated apart from each other in (a) and (b) in FIG. 5. Also, in (a) and (b) in FIG. 5, the second compression bonding terminal 35b is provided on the surface of the second connection portion 35 on the positive side of the X-axis, and a compression bonding terminal 43b is provided on the surface of the connection portion 43 on the negative side of the X-axis. The compression bonding terminal 43b is formed at the front end of a wiring pattern 43a.

As illustrated in (a) in FIG. 5, in the embodiment, a width L1 of the second compression bonding terminal 35b provided in the second connection portion 35 is smaller than a width L2 of the compression bonding terminal 43b provided in the connection portion 43. Although not illustrated, the width of the first compression bonding terminal 34b provided in the first connection portion 34 is larger than the width of the second compression bonding terminal 35b and smaller than the width of the compression bonding terminal 43b. As explained above, the width of the first compression bonding terminal 34b, and the width L1 of the second compression bonding terminal 35b are determined by the respective amounts of correction.

As illustrated in (b) in FIG. 5, the printed board 30 is thermally expanded by the heating in the compression bonding step (see the arrow in FIG. 5). Thus, the width of the second compression bonding terminal 35b is changed to the width L2 greater than the width L1. That is, due to thermal expansion by heating, the width of the second compression bonding terminal 35b becomes equal to the width of the compression bonding terminal 43b of the second flexible board 42. In other words, the width L1 of the second compression bonding terminal 35b is determined by the width L2 of the compression bonding terminal 43b and the amount of expansion of the second board section 32.

For instance, when the widths of the second compression bonding terminal 35b and the compression bonding terminal 43b are equal before compression bonding, due to thermal expansion by heating, the positions of the second compression bonding terminal 35b and the compression bonding terminal 43b are displaced, the contact area may be reduced, and the contact resistance may be increased. On the other hand, in the printed board 30 according to the embodiment, the widths of the second compression bonding terminal 35b and the compression bonding terminal 43b becomes equal at the time of heating, and thus the contact area between the second compression bonding terminal 35b and the compression bonding terminal 43b is increased, and increase in the contact resistance can be avoided. The time of heating indicates a time point when the printed board 30 is heated and a predetermined temperature (a temperature for compression bonding the ACF) is reached.

The same goes with the first compression bonding terminal 34b. That is, the width of the first compression bonding terminal 34b at the time of heating becomes equal to the width of the compression bonding terminal of the first flexible board 41. In other words, the width of the first compression bonding terminal 34b is determined by the width of the compression bonding terminal of the first flexible board 41, and the amount of expansion of the first board section 31.

Although a description has been given above under the assumption that the width of the compression bonding terminal 43b is constant before heating and at the time of heating for the sake of convenience, the width of the compression bonding terminal 43b may also be changed by the heating. The widths of the first compression bonding terminal 34b and the second compression bonding terminal 35b may be determined in consideration of the width of the compression bonding terminal 43b at the time of heating.

When the thickness of the printed board 30 is 1 mm, the length of the first board section 31 is 250 mm, and the length of the second board section 32 is 250 mm, as an example, the amount of expansion at the time of heating is 0.70 mm for the first board section 31, and 0.120 mm for the second board section 32.

[3. Effects]

As described above, the printed board 30 according to the embodiment is an elongated printed board to be electrically coupled to the display panel 20 via the flexible boards 40. The printed board has the first board section 31, and the second board section 32 which has a length shorter than the first board section 31, the length being in the substantially perpendicular direction to the longitudinal direction of the printed board 30. The first board section 31 and the second board section 32 are disposed in a row in the longitudinal direction of the printed board 30, and the first board section 31 and the second board section 32 respectively have the first ends 31a and 32a in the substantially perpendicular direction to the longitudinal direction of the printed board 30. The first end 31a of the first board section 31 projects further than the first end 32a of the second board section 32 in the substantially perpendicular direction to the longitudinal direction of the printed board 30, and the connection portion 33 to be connected to a flexible board 40 is disposed in each of the first end 31a of the first board section 31 and the first end 32a of the second board section 32.

Thus, miniaturization of the printed board 30 can be achieved by making the outer shape of the printed board 30 a variant shape. Thus, the cost of the printed board 30 can be reduced. Also, the connection portion 33 which connects the flexible board 40 is disposed in the first ends 31a and 32a, and thus when the flexible board 40 and the printed board 30 are connected, the length of a flexible board 40 connected to the second board section 32 which has a large amount of expansion due to thermal expansion and is likely to cause wrinkles to occur in the flexible board 40 can be made longer than the length of a flexible board 40 connected to the first board section 31 which has a small amount of expansion due to thermal expansion and is less likely to cause wrinkles to occur in the flexible board 40. A long flexible board 40 (for instance, the second flexible board 42) is connected to the second board section 32 which is likely to cause wrinkles to occur in the flexible board 40, and thus wrinkles occurs in the flexible board 40 can be reduced, and it is possible to ensure of reliability. Furthermore, a short flexible board 40 (for instance, the first flexible board 41) is connected to the first board section 31 which is less likely to cause wrinkles to occur in the flexible board 40, and thus an unnecessarily long flexible board 40 can be avoided. Consequently, with the printed board 30 according to the embodiment, it is possible to achieve both ensuring of reliability and cost reduction.

It is to be noted that the amount of expansion of the printed board 30 due to thermal expansion is greater for a longer length of the printed board 30 in the longitudinal direction. Thus, for a longer length of the printed board 30 in the longitudinal direction, in other words, for a larger size of the display panel 20, the printed board 30 according to the embodiment has a greater effect on the reliability.

Also, the first board section 31 and the second board section 32 further respectively have the second ends 31b and 32b on the opposite side of the first ends 31a and 32a, and the second ends 31b and 32b have a linear shape in a plan view.

Therefore, the number of processing steps for cutting the printed board 30 from an original board can be reduced, as compared when the second ends 31b and 32b have a variant shape. Consequently, the printed board 30 providing further reduced cost can be achieved.

Also, the lengths of the first board section 31 and the second board section 32 in the longitudinal direction of the printed board 30 are equal.

Therefore, multiple printed boards 30 having the same shape can be produced from one original board. Consequently, the printed board 30 providing further reduced cost can be achieved.

Also, the connection portion 33 has the first connection portion 34 disposed at the first end 31a of the first board section 31, and the second connection portion 35 disposed at the first end 32a of the second board section 32. The length of the first compression bonding terminal 34b (an example of a connection terminal) provided in the first connection portion 34 in the longitudinal direction of the printed board 30 is longer than the length of the second compression bonding terminal 35b (an example of a connection terminal) provided in the second connection portion 35 in the longitudinal direction of the printed board 30.

Thus, the width of the second compression bonding terminal 35b provided in the second connection portion 35 which is likely to be thermally expanded is made smaller than the width of the first compression bonding terminal 34b provided in the first connection portion 34 which is less likely to be thermally expanded. Therefore, the widths of the respective compression bonding terminals provided in the first board section 31 and the second board section 32 are determined according to the amounts of expansion of the first board section 31 and the second board section 32.

For instance, the width of the first compression bonding terminal 34b provided in the first connection portion 34 may be determined based on the amount of expansion of the first connection portion 34, and the width of each compression bonding terminal of the first flexible board 41 to be connected to the first connection portion 34. Also, the width of the second compression bonding terminal 35b provided in the second connection portion 35 may be determined based on the amount of expansion of the second connection portion 35, and the width of each compression bonding terminal 43b of the second flexible board 42 to be connected to the second connection portion 35. Thus, after compression bonding, it is possible to avoid reduction in the contact area between the first compression bonding terminal 34b of the first connection portion 34, and the compression bonding terminal of the flexible board 40, and in the contact area between the second compression bonding terminal 35b of the second connection portion 35, and the compression bonding terminal of the flexible board 40, the reduction being possibly caused by thermal expansion at the time of compression bonding. In other words, increase in the contact resistance between the first connection portion 34, the second connection portion 35, and the flexible boards 40 can be avoided.

Also, multiple electronic components are disposed in the printed board 30, and an electronic component having a greatest length among the multiple electronic components is mounted on the first board section 31, the length being in the substantially perpendicular direction to the longitudinal direction of the printed board 30.

Thus, the width of the second board section 32 can be made smaller than the length of the electronic component having the greatest length. In short, the printed board 30 can be miniaturized.

Also, the display device 100 according to the embodiment includes the display panel 20, the printed board 30 described above, and the flexible boards 40 that couple the display panel 20 and the printed board 30. The flexible boards 40 include the first flexible boards 41 that couple the first board section 31 and the display panel 20, and the second flexible boards 42 that couple the second board section 32 and the display panel 20. The length of each of the first flexible boards 41 in the substantially perpendicular direction to the longitudinal direction of the printed board 30 is shorter than the length of each of the second flexible boards 42 in the substantially perpendicular direction to the longitudinal direction of the printed board 30.

Consequently, it is possible to implement the display device 100 including the printed board 30 that can achieve both ensuring of reliability and cost reduction.

Also, the method of manufacturing the display device 100 according to the embodiment includes a preparation step (S10) for preparing the display panel 20, the printed board 30 described above, and the flexible boards 40 that couple the display panel 20 and the printed board 30, and a compression bonding step (S20) for compression-bonding the printed board 30 and the flexible boards 40. In the preparation step, the first flexible board 41, and the second flexible board 42 longer than the first flexible board 41 are prepared. Also, in the compression bonding step, the connection portion 33 disposed at the first end 31a of the first board section 31 and the first flexible board 41 are compression-bonded, and the connection portion 33 disposed at the first end 32a of the second board section 32 and the second flexible board 42 are compression-bonded.

Thus, the method provides the same effect as that of the display device 100.

Other Embodiments

Although the printed board 30, the display device 100, and the method of manufacturing the display device 100 according to the present disclosure have been described in the above based on the embodiment, the printed board 30, the display device 100, and the method of manufacturing the display device 100 according to the present disclosure are not limited to the above-described embodiment. Another embodiment achieved by combining any components in the embodiment, variations obtained by applying various modifications, which occur to those skilled in the art, to the foregoing embodiment within the scope of the essence of the present disclosure, and various apparatuses having the printed board and the display device according to the embodiment are also included in the scope of the present disclosure.

In the embodiment, an example has been described in which the printed board 30 is used for a display panel of a television or the like. However, the embodiment is not limited to this. For instance, the printed board 30 may be used for a display device of a mobile terminal such as a smartphone or a tablet.

In the embodiment, an example has been described in which the printed board 30 has an elongated shape in a plan view. However, the printed board 30 may have a square shape in a plan view. Also, each of the first board section 31 and the second board section 32 may have a square shape.

Figure 6:
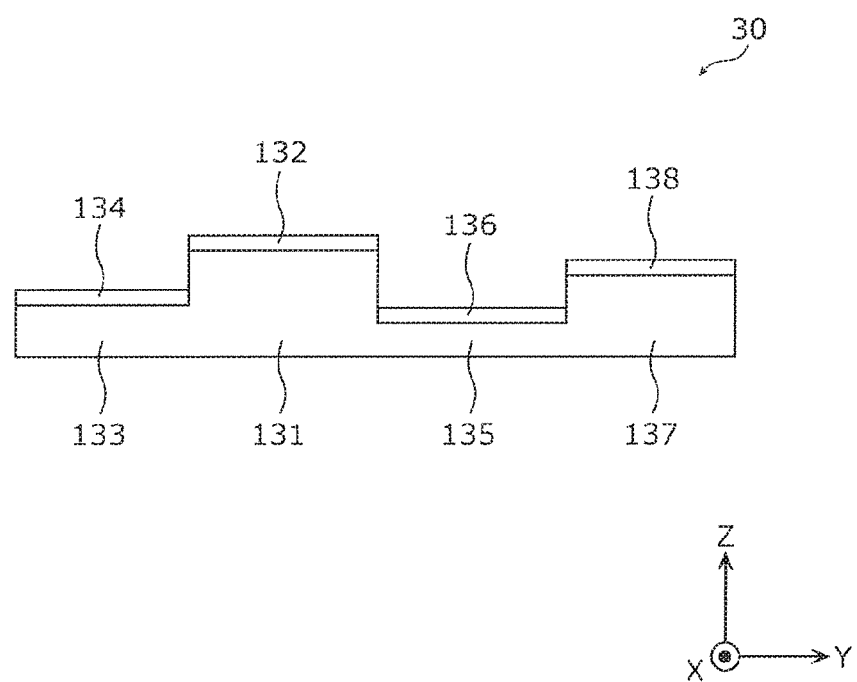
FIG. 6 is a schematic view illustrating the configuration of a printed board according to another embodiment.

In the embodiment, an example has been described in which the printed board 30 includes the first board section 31 and the second board section 32. However, the embodiment is not limited to this. For instance, the printed board 30 may include a third board section which is different in width from the first board section 31 and the second board section 32. In this case, the printed board 30 and the display panel 20 are electrically coupled using the flexible boards having three lengths according to the varying widths of the printed board 30. For instance, as illustrated in FIG. 6, the printed board 30 may be a printed board including a first board section 131, a second board section 133, a third board section 135, and a fourth board section 137 which have different widths. A first connection portion 132 to be connected to corresponding flexible boards 40 is disposed at the end of the first board section 131 on the positive side of the Z-axis. Similarly, a second connection portion 134 to be connected to corresponding flexible boards 40 is disposed at the end of the second board section 133 on the positive side of the Z-axis, a third connection portion 136 to be connected to corresponding flexible boards 40 is disposed at the end of the third board section 135 on the positive side of the Z-axis, and a fourth connection portion 134 to be connected to corresponding flexible boards 40 is disposed at the end of the fourth board section 133 on the positive side of the Z-axis. Also, the printed board 30 may include multiple sets of the first board section 31 and the second board section 32 illustrated in (a) in FIG. 3. In other words, multiple projections and depressions may be formed in the printed board in a plan view.

In the embodiment, an example has been described in which the width of each of the first compression bonding terminal 34b and the second compression bonding terminal 35b provided in the printed board 30 is smaller than the width of a corresponding compression bonding terminal provided in the flexible boards 40. However, the embodiment is not limited to this. The first compression bonding terminal 34b and the second compression bonding terminal 35b may have a width that does not cause a poor connection at the time of compression bonding. For instance, the first compression bonding terminal 34b, the second compression bonding terminal 35b, and the corresponding compression bonding terminal may be formed to have the same width.

In the embodiment, an example has been described in which an electronic component having the largest size is mounted on the first board section 31. However, the embodiment is not limited to this. For instance, an electronic component having the largest size may be mounted on the second board section 32. Also, no electronic component may be mounted on one of the first board section 31 and the second board section 32.

In the embodiment, an example has been described in which the lengths of the first board section 31 and the second board section 32 in the longitudinal direction of the printed board 30 are equal. However, the embodiment is not limited to this. the lengths of the first board section 31 and the second board section 32 in the longitudinal direction of the printed board 30 may be different.

In the embodiment, an example has been described in which the width of each compression bonding terminal is corrected according to the amount of expansion of the first connection portion 34 and the second connection portion 35. However, the correction is not limited to this. For instance, the width between compression bonding terminals (the length in the Y-axis direction) may be corrected according to the amount of expansion of the first connection portion 34 and the second connection portion 35. In this case, for instance, the width of each of the first compression bonding terminal 34b and the second compression bonding terminal 35b is the same as the width of a corresponding compression bonding terminal of the flexible boards 40, and the width between the first compression bonding terminals 34b and the width between the second compression bonding terminals 35b are different from the width between compression bonding terminals of the flexible boards 40. Specifically, the width between the first compression bonding terminals 34b and the width between the second compression bonding terminals 35b before the correction are smaller than the width between compression bonding terminals of the flexible boards 40. It is to be noted that the width between compression bonding terminals is the length between the opposing sides of adjacent compression bonding terminals in a plan view.

In the embodiment, an example has been described in which the second ends 31b and 32b have a linear shape in a plan view. However, the shape of the second ends 31b and 32b is not particularly limited. Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to a display device that uses a printed board coupled to a display panel via a flexible board, and is useful particularly for a display device including a large display panel.

The invention claimed is:

1. A printed board in an elongated shape to be electrically coupled to a display panel via a flexible board, the printed board comprising: a first board section; and a second board section that is shorter in length than the first board section in a substantially perpendicular direction to a longitudinal direction of the printed board, wherein the first board section and the second board section are adjacent to each other in a row in the longitudinal direction, the first board section and the second board section each have a first end in the substantially perpendicular direction, the first end of the first board section projects further than the first end of the second board section in the substantially perpendicular direction, and a connection portion that is configured to be directly connected to the flexible board is disposed at the first end of each of the first board section and the second board section wherein the flexible board is configured to be directly connected to the display panel; wherein the connection portion has a first connection portion disposed at the first end of the first board section, and a second connection portion disposed at the first end of the second board section, and a length of a connection terminal provided in the first connection portion in the longitudinal direction is longer than a length of a connection terminal provided in the second connection portion in the longitudinal direction.

2. The printed board according to claim 1,
wherein the first board section and the second board section further each have a second end on an opposite side of the first end, and
the second end has a linear shape in a plan view.

3. The printed board according to claim 1,
wherein lengths of the first board section and the second board section in the longitudinal direction are equal.

4. The printed board according to claim 1,
wherein a plurality of electronic components are disposed in the printed board, and
an electronic component having a greatest length in the substantially perpendicular direction among the plurality of electronic components is mounted on the first board section.

5. A display device comprising:
a display panel;
the printed board according to claim 1; and
a flexible board that couples the display panel and the printed board,
wherein the flexible board includes a first flexible board that couples the first board section and the display panel, and a second flexible board that couples the second board section and the display panel, and
a length of the first flexible board in the substantially perpendicular direction to the longitudinal direction of the printed board is shorter than a length of the second flexible board in the substantially perpendicular direction.

6. A method of manufacturing a display device, the method comprising:
preparing a display panel, the printed board according to claim 1, and the flexible board that couples the display panel and the printed board; and
compression bonding the printed board and the flexible board,
wherein in the preparing, a first flexible board and a second flexible board are prepared, the second flexible board being longer in length than the first flexible board in a direction perpendicular to a longitudinal direction of the printed board, and
in the compression bonding, the connection portion disposed at the first end of the first board section and the first flexible board are compression-bonded, and the connection portion disposed at the first end of the second board section and the second flexible board are compression-bonded.

7. A display device with a display panel to which a printed board in an elongated shape to be electrically connected via a flexible board, the display panel comprising:
a printed board, including
a first board section; and a second board section that is shorter in length than the first board section in a substantially perpendicular direction to a longitudinal direction of the printed board, wherein the first board section and the second board section are adjacent to each other in a row in the longitudinal direction, the first board section and the second board section each have a first end in the substantially perpendicular direction, the first end of the first board section projects further than the first end of the second board section in the substantially perpendicular direction, and a connection portion that is configured to be directly connected to one end of the flexible board is disposed at the first end of each of the first board section and the second board section, wherein an other end of the flexible board is configured to be directly connected to the display panel; wherein the connection portion has a first connection portion disposed at the first end of the first board section, and a second connection portion disposed at the first end of the second board section, and a length of a connection terminal provided in the first connection portion in the longitudinal direction is longer than a length of a connection terminal provided in the second connection portion in the longitudinal direction.

8. A display device according to claim 7,
wherein the length of the flexible board connected to the first board section is shorter than that is connected to the second board section.

* * * * *